US012597808B2

(12) United States Patent
Becker et al.

(10) Patent No.: US 12,597,808 B2
(45) Date of Patent: Apr. 7, 2026

(54) COMPACT OPTOELECTRONIC TRANSMITTER AND RECEIVER DEVICE

(71) Applicant: ams-OSRAM International GmbH, Regensburg (DE)

(72) Inventors: Dirk Becker, Langquaid (DE); Norwin von Malm, Thumhausen/Nittendorf (DE); Tim Boescke, Regensburg (DE); Alvaro Gomez-Iglesias, Regensburg (DE); Martin Hetzl, Painten (DE); Horst Varga, Lappersdorf (DE); Tansen Varghese, Regensburg (DE)

(73) Assignee: AMS-OSRAM INTERNATIONAL GMBH, Regensburg (DE)

( * ) Notice: Subject to any disclaimer, the term of this patent is extended or adjusted under 35 U.S.C. 154(b) by 101 days.

(21) Appl. No.: 18/694,514

(22) PCT Filed: Aug. 17, 2022

(86) PCT No.: PCT/EP2022/072920

§ 371 (c)(1),
(2) Date: Mar. 22, 2024

(87) PCT Pub. No.: WO2023/046374

PCT Pub. Date: Mar. 30, 2023

(65) Prior Publication Data

US 2025/0132607 A1 Apr. 24, 2025

(30) Foreign Application Priority Data

Sep. 23, 2021 (DE) ..................... 10 2021 210 621.8

(51) Int. Cl.
*H02J 50/30* (2016.01)
*H02J 50/40* (2016.01)
(Continued)

(52) U.S. Cl.
CPC .............. *H02J 50/30* (2016.02); *H02J 50/40* (2016.02); *H10F 55/255* (2025.01); *H10F 77/40* (2025.01)

(58) Field of Classification Search
CPC .......... H02J 50/30; H02J 50/40; H02J 50/402; H10F 55/255; H10F 77/40
See application file for complete search history.

(56) References Cited

U.S. PATENT DOCUMENTS

| | | | |
|---|---|---|---|
| 6,265,653 B1 | 7/2001 | Haigh et al. | |
| 7,215,891 B1 | 5/2007 | Chiang et al. | |
| (Continued) | | | |

FOREIGN PATENT DOCUMENTS

| | | |
|---|---|---|
| DE | 102018109532 A1 | 10/2019 |
| WO | 2018105358 A1 | 6/2018 |
| WO | 2021055140 A1 | 3/2021 |

OTHER PUBLICATIONS

Bergler, C. (Authorized officer), International Search Report and Written Opinion issued in International Patent Application No. PCT/EP2022/072920, with English language translation, 13 pages.
(Continued)

*Primary Examiner* — Seung C Sohn

(74) *Attorney, Agent, or Firm* — MH2 Technology Law Group LLP

(57) ABSTRACT

The invention relates to an optoelectronic device including a transmitter designed to emit electromagnetic radiation and to be operated with an input voltage, and a receiver designed to receive the electromagnetic radiation and to provide an output voltage, the transmitter including at least one surface emitter, and the receiver comprising at least one photodiode.

9 Claims, 12 Drawing Sheets

(51) Int. Cl.
　　H10F 55/255 　　　(2025.01)
　　H10F 77/40 　　　(2025.01)

(56) References Cited

U.S. PATENT DOCUMENTS

| | | | | |
|---|---|---|---|---|
| 2003/0223756 A1* | 12/2003 | Tatum | .................... | H04B 10/40 |
| | | | | 398/128 |
| 2006/0067690 A1* | 3/2006 | Tatum | ...................... | H04N 7/22 |
| | | | | 398/66 |
| 2006/0138495 A1 | 6/2006 | Li et al. | | |
| 2010/0158067 A1 | 6/2010 | Nakatsuka et al. | | |
| 2014/0061679 A1 | 3/2014 | Guo | | |
| 2018/0190855 A1 | 7/2018 | Male | | |
| 2019/0296522 A1 | 9/2019 | Johnson et al. | | |
| 2021/0083141 A1 | 3/2021 | Scheller et al. | | |

OTHER PUBLICATIONS

German Office Action issued in German Patent Application No. 102021210621.8, 6 pages.
Behfar, A., Horizontal Cavity Surface-Emitting Laser (HCSEL) Devices, SPIEDigitalLibrary.org/conference-proceedings-of-spie, 8 pages.
Building a Safe and Robust Industrial System, Avago Technologies, http://www.eeweb.com/building-a-safe-and-robust-industrial-system/, 8 pages.

* cited by examiner

COMPACT OPTOELECTRONIC TRANSMITTER AND RECEIVER DEVICE

CROSS-REFERENCE TO RELATED APPLICATIONS

The present application is a national stage entry from International Application No. PCT/EP2022/072920, filed on Aug. 17, 2022, published as International Publication No. WO 2023/046374 A1 on Mar. 30, 2023, and claims priority to German Patent Application No. 10 2021 210 621.8, filed Sep. 23, 2021, the disclosures of all of which are hereby incorporated by reference in their entireties.

FIELD

An optoelectronic device is specified.

BACKGROUND

An object to be achieved is to specify an optoelectronic device which may be made particularly compact.

SUMMARY

In accordance with at least one embodiment, the optoelectronic device comprises a transmitter. The transmitter is configured to emit electromagnetic radiation. Furthermore, the transmitter is configured to be operated with an input voltage. The transmitter can be for example a component which generates electromagnetic radiation in the wavelength range between infrared radiation and UV radiation. In particular, the transmitter may be configured to generate electromagnetic radiation in the wavelength range of at least 350 nm to at most 1100 nm, in particular in the wavelength range of at least 800 nm to at most 950 nm, during operation.

In accordance with at least one embodiment of the optoelectronic device, the optoelectronic device comprises a receiver configured to emit electromagnetic radiation and to supply an output voltage. The receiver is configured in particular to receive the electromagnetic radiation emitted by the transmitter during operation and to convert it at least partly into electrical energy. In this case, the receiver may be coordinated with the transmitter in particular in such a way that the receiver comprises a particularly high absorption for the electromagnetic radiation generated by the transmitter.

In accordance with at least one embodiment of the optoelectronic device, the transmitter comprises at least one surface emitter. In the present case, a surface emitter is understood to mean a radiation-emitting component which radiates the electromagnetic radiation generated during operation transversely, in particular perpendicularly, with respect to a mounting surface on which the radiation-emitting component is mounted. In particular, the surface emitter may be a semiconductor component comprising an epitaxially grown semiconductor body. The direction in which the electromagnetic radiation is then radiated during operation may be in particular parallel to a growth direction of the semiconductor body. The semiconductor body may be based for example on semiconductor materials, such as In(Ga)N, In(Ga)AlP, (Al)GaAs, (In)GaAs.

The surface emitter may be for example a light-emitting diode or a laser diode, in particular a superluminescence diode or a VCSEL. In this case, the transmitter may contain a plurality of surface emitters, which may be interconnected in series and/or in parallel with one another. The input voltage of the transmitter is then correspondingly calculated from the voltages with which the surface emitters are operated.

In accordance with at least one embodiment of the optoelectronic device, the optoelectronic device comprises a receiver comprising at least one photodiode. The photodiode may comprise a semiconductor body comprising at least one detecting layer configured to absorb the electromagnetic radiation generated by the at least one surface emitter during operation and to convert it into electrical energy. The at least one photodiode may be constituted for example in the same material system as the at least one surface emitter. The receiver may comprise in particular a plurality of photodiodes, which may be interconnected in series or in parallel with one another. The output voltage of the receiver is then correspondingly calculated from the voltage dropped across the individual photodiodes.

In accordance with at least one embodiment of the optoelectronic device, the optoelectronic device comprises a transmitter configured to emit electromagnetic radiation and to be operated with an input voltage, and a receiver configured to receive the electromagnetic radiation and to supply an output voltage, wherein the transmitter comprises at least one surface emitter and the receiver comprises at least one photodiode.

The optoelectronic device described here is based in this case on the following considerations, inter alia.

Many applications, such as, for example, in acoustics, in radiation control technologies such as, for instance, MEMS, actuators, detectors, such as avalanche photodiodes, single-photon avalanche diodes or photomultipliers, require high-voltage supplies with relatively low current consumption. Such applications may require voltages of more than 50 V, 100 V, 500 V, 1000 V, 2000 V, 10 000 V or more, while at the same time the intention is to maintain a small footprint of the device in regard to size, weight, costs and energy consumption. These properties are particularly important for mobile devices such as, for instance, AR-VR glasses, portable in-ear headphones and automotive applications.

A further problem to be solved in the case of high-voltage generators with a small space requirement is the connection of low- and high-voltage paths, which should be galvanically isolated in order to ensure the functional reliability and long-term stability of a device under changing ambient conditions such as temperature, moisture, dust.

In this case, the optoelectronic device described here may advantageously be used as an optical voltage transformer. Furthermore, the optoelectronic device described here makes it possible to convert a high voltage at the input side into a low voltage at the receiver. Furthermore, the present device enables an AC voltage to be transformed into a DC voltage, and vice versa. Finally, the present device also makes it possible to transfer energy from the transmitter side to the receiver side in a galvanically isolated manner, without a change in voltage taking place in the process.

The optoelectronic device described here may thus constitute for example a transformer which manages without inductive elements, in particular without coils. As a result, firstly, the installation space is particularly small in comparison with conventional transformers; secondly, strong magnetic fields do not arise during the transformation. As a result, influencing caused by external magnetic and/or electric fields is also precluded. Consequently, the optoelectronic device may be used in areas for which magnetic influencing would be critical or which are provided with high external magnetic fields. At the same time, the optical power transfer in the optoelectronic device ensures galvanic isolation of the high-voltage side and the low-voltage side.

By obviating the need to use switched elements, as is the case in boost or buck converters or would be necessary in the case of an inductive transformer, for example, it is possible for the output voltage generated to be free of disturbances. This may be the case in particular during use in measuring systems and/or monitoring systems in a very small space, which react sensitively to disturbances of the supply voltage.

For the case where the input voltage is greater than the output voltage, it is possible to exploit the fact that the power to be maximally drawn at the receiver side is directly proportional to the power fed in at the transmitter side. As a result, it is possible to monitor changes in current and voltage on the transmitter side. This may be used for example for the galvanically isolated monitoring of high voltages. On account of the nonlinear characteristic curve of the transmitter, in this case particularly well-defined pulses may be generated on the transmitter side, which is not the case for purely electronic solutions, for example in switched-mode power supplies.

A further concept of the device described here is to combine semiconductor light emitters and photodiodes, i.e. photovoltaic cells, in order to achieve a conversion from low voltage into high voltage. On the low-voltage path, for this purpose, for example, one or a plurality of surface emitting semiconductor lasers, light-emitting diodes or superluminescence diodes connected in parallel with emit one another light. The wavelength of the emitted light may be between 350 nm and 1100 nm, depending on the semiconductor materials used, for example: In(Ga)N, In(Ga)AlP, (Al)GaAs, (In)GaAs. Typical input voltages are 1 V, 3 V, 5 V, 8 V, 10 V or therebetween.

On the high-voltage side, which is galvanically isolated from the low-voltage side, an array of series-connected photodiodes operating in the photovoltaic mode collects the emitted light. Depending on the material used, for example Si, InGaAs, GaAs, InGaN or perovskite, each individual photodiode generates a voltage of the order of magnitude of 0.5-3 V and a current depending on the intensity of the incident light. Owing to the use of a large number of photodiodes, all of which may be connected in series on a very small wafer scale, these individual voltages add up to a high total voltage that may exceed 10 V, 50 V, 100 V, 500 V, 1000 V, 10 000 V.

Owing to the high output power of the transmitter, it is possible to use just a single surface emitter or a small number of surface emitters for illuminating the photodiodes, which reduces size and costs of the device on the transmitter side.

With a focused light cone of the surface emitters, it is also possible to compress the distance and the area of the receiver to a small scale.

Overall, the present device makes it possible to transfer energy and/or convert voltage in a particularly compact component. In this case, the optoelectronic device is insensitive to external influences such as electromagnetic fields, for example.

In accordance with at least one embodiment of the optoelectronic device, the input voltage is less than the output voltage and the receiver comprises a plurality of photodiodes interconnected in series with one another. In this case, it is possible, for example, for the transmitter likewise to comprise a plurality of surface emitters, which are then interconnected in parallel with one another, for example. In particular, the input voltage of the transmitter is less than the output voltage of the receiver. The device is therefore configured to convert a low input voltage into a high output voltage. For this purpose, the receiver may comprise a plurality of photodiodes, for example at least 10 photodiodes, in particular at least 50 or at least 100 individual photodiodes. The output voltage may be adjusted in a simple manner by way of the number of photodiodes connected in series with one another.

In accordance with at least one embodiment of the optoelectronic device, the input voltage is greater than the output voltage and the transmitter comprises a plurality of surface emitters interconnected in series with one another. In this case, it is possible, in particular, for the optoelectronic device to comprise more surface emitters than photodiodes. Furthermore, it is possible for the device to comprise, at the receiver, a plurality of photodiodes interconnected at least partly in parallel with one another. This device makes it possible to convert a high input voltage into a lower output voltage.

In accordance with at least one embodiment of the optoelectronic device, the transmitter comprises two series circuits of surface emitters, which are interconnected antiparallel with one another. In this way, an AC voltage may be transformed into a DC voltage by the device. In particular, a high AC voltage may be transformed into a lower, optionally pulsed, DC voltage.

In accordance with at least one embodiment of the optoelectronic device, the optoelectronic device comprises an optical unit which directs or guides the electromagnetic radiation from the transmitter to the receiver. In other words, in this embodiment, the receiver is not directly irradiated with electromagnetic radiation from the transmitter, rather the electromagnetic radiation is deflected by an optical unit, such that it impinges on the receiver or is guided from the transmitter to the receiver. The optical unit makes it possible to focus the electromagnetic radiation, to split the electromagnetic radiation and/or to change the direction of the electromagnetic radiation. A particularly compact arrangement of transmitter and receiver relative to one another is made possible as a result.

In accordance with at least one embodiment of the optoelectronic device, the optical unit is integrated into a housing for the transmitter and the receiver or the optical unit is part of the housing. That is to say that, in this embodiment, the device comprises a housing, which surrounds the transmitter and the receiver at least in places and protects them from mechanical or chemical loading, for example. The optical unit that directs or guides the electromagnetic radiation from the transmitter to the receiver is integrated into the housing or embodied as part of the housing.

In accordance with at least one embodiment of the optoelectronic device, the optical unit is integrated into a potting body for the transmitter and the receiver or the optical unit is part of the potting body. In this case, the transmitter and the receiver are potted with a common potting body, which is transmissive, for example transparent, to the electromagnetic radiation generated in the transmitter, for example. The potting body may be molded in places onto transmitter and/or receiver and may be in direct contact therewith. The optical unit that directs or guides the electromagnetic radiation from the transmitter to the receiver is integrated into the potting body or the potting body forms said optical unit.

In accordance with at least one embodiment of the optoelectronic device, the optical unit comprises two or more optical elements. By way of example, the optical unit may comprise a plurality of reflective surfaces and/or a plurality of structured surfaces which act as mirrors and/or lenses which direct or guide the electromagnetic radiation to the receiver.

In accordance with at least one embodiment of the optoelectronic device, an optical element is assigned one-to-one to each photodiode of the receiver. That is to say that, in this embodiment, for each photodiode of the receiver there is exactly one optical element which directs or guides electromagnetic radiation to the assigned photodiode. By way of example, the optical element may be a mirror or a lens. Such an optical element makes it possible, for example, to distribute the electromagnetic radiation particularly uniformly over a radiation entrance surface of the assigned photodiode, such that the electromagnetic radiation impinges particularly uniformly on a detecting layer of the photodiode.

In accordance with at least one embodiment of the optoelectronic device, the optoelectronic device comprises a carrier having a top surface, wherein the transmitter and the receiver are arranged at the top surface and a radiation exit side of the transmitter and a radiation entrance side of the receiver are directed away from the top surface.

Such a configuration of the device makes it possible to arrange transmitter and receiver particularly compactly next to one another at the top surface of a common carrier. In this way, the device may be embodied with a particularly small footprint; by way of example, it is also possible in this case for the device to be embodied as surface-mountable.

The carrier may be a connection carrier, in particular, on which the transmitter and the receiver are mechanically secured and via which the transmitter and the receiver are electrically contactable. In this case, it is possible for an interconnection of the surface emitters among one another and of the photodiodes among one another to be effected via the carrier. The carrier may have vias through the carrier which make it possible for the device to be embodied as surface-mountable. The device then comprises for example a housing or a potting body for the transmitter and the receiver, which comprise or form an optical element which directs or guides electromagnetic radiation from the transmitter to the receiver.

In accordance with at least one embodiment, the optoelectronic device comprises a first carrier, on which the transmitter is arranged, and a second carrier, on which the receiver is arranged, wherein the first carrier and the second carrier are arranged opposite one another. In this case, transmitter and receiver are not embodied on a common carrier, but rather are connected to one another for example by way of a housing or a potting body that is arranged between the first carrier and the second carrier. This enables a modular construction of the device, such that different transmitters may be combined with identical receivers, or vice versa, in a particularly simple manner during production.

In accordance with at least one embodiment of the device, the receiver comprises a plurality of photodiodes connected to one another by means of tunnel junctions. That is to say that the photodiodes are embodied as detecting layers, for example, between which are arranged tunnel junctions that interconnect the detecting layers in series with one another. In this case, the photodiodes may be arranged in a common semiconductor body and may be jointly produced epitaxially. The photodiodes are monolithically integrated with one another in this case. It is possible here, in particular, for the different photodiodes to be configured to have a particularly high absorption at different wavelengths or for different wavelength ranges. Overall, it is possible in this way for the receiver having a plurality of photodiodes to be embodied in a particularly compact fashion.

In accordance with at least one embodiment of the optoelectronic device, the transmitter comprises two or more surface emitters configured to emit electromagnetic radiation from different wavelength ranges, and the receiver comprises two or more photodiodes coordinated with the different wavelength ranges. In this case, the receiver may comprise for example photodiodes connected to one another by means of tunnel junctions. In this way, surface emitters that emit electromagnetic radiation in different wavelength ranges may direct their radiation at the radiation entrance surface of the receiver and the radiation is absorbed there principally by the photodiode coordinated with the wavelength range.

In accordance with at least one embodiment of the device, the surface emitter comprises a resonator having a resonator axis running parallel to a main extension plane of an active region of the surface emitter. Electromagnetic radiation is generated in the active region of the surface emitter during operation. In this case, the surface emitter is configured to the effect that the electromagnetic radiation leaves the surface emitter transversely or perpendicularly with respect to the resonator axis. In other words, the surface emitter is for example a laser diode having an active region embodied in the manner of an edge emitter. However, a deflection of the electromagnetic radiation takes place in the laser diode in such a way that the radiation leaves the surface emitter transversely or perpendicularly with respect to the main extension plane of the active region. A surface emitter of this type is described in a different context for example in the document WO 2019/170636, the disclosure content of which is hereby expressly incorporated by reference. That is to say that the surface emitter may be embodied in particular like the semiconductor laser described therein.

Such a surface emitter may be produced exclusively using on-wafer processes, for example, which significantly reduces the production costs. Furthermore, the vertical emission makes it possible that transmitter and receiver may be mounted on parallel planes, which enables more compact packaging.

The optoelectronic device described here is explained in greater detail below on the basis of exemplary embodiments and with reference to the associated figures.

BRIEF DESCRIPTION OF THE DRAWINGS

FIGS. 1 to 18 show schematic illustrations that are taken as a basis for more detailed explanation of exemplary embodiments of devices described here.

DETAILED DESCRIPTION

Elements s that are identical, of identical type or act identically are provided with the same reference signs in the figures. The figures and the size relationships of the elements illustrated in the figures among one another should not be regarded as to scale. Rather, individual elements may be illustrated with an exaggerated size for clarity of presentation and/or for clarity of understanding.

Figures 1, 2:
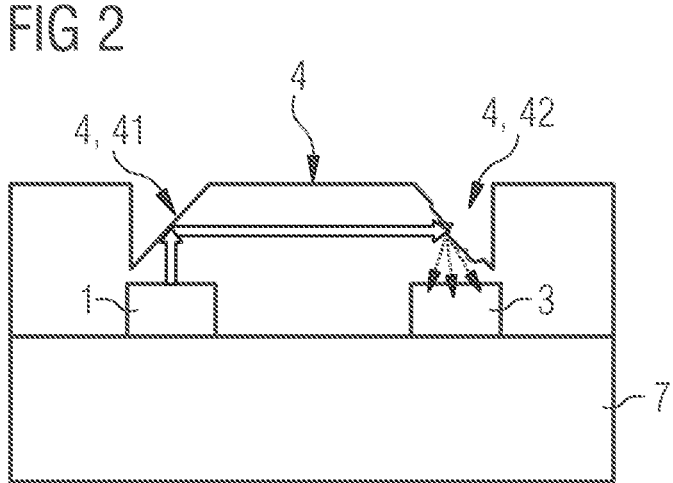

FIG. 1 shows a schematic sectional illustration of a device described here. The device comprises a transmitter 1 comprising at least one surface emitter, in particular a plurality of surface emitters 10. Furthermore, the device comprises a receiver 3 comprising at least one photodiode, in particular a plurality of photodiodes 30. Transmitter 1 and receiver 3 are arranged at the top surface 71 of a carrier 7.

The surface emitters 10 each comprise a radiation exit surface 11 directed away from the top surface 71 of the carrier 7. The photodiodes 30 each comprise a radiation entrance side 31 directed away from the top surface 71.

Transmitter 1 and receiver 3 are surrounded by a common potting body 6. The potting body 6 is embodied with a transparent material that is transparent to the wavelength of the electromagnetic radiation 2 generated in the transmitter 1. For example, the electromagnetic radiation 2 is in a wavelength range of at least 800 to at most 950 nm. The potting body 6 may be constituted with an epoxy-based material or a silicone-based material, for example. The potting body 6 is molded onto the surface emitters 10 and the photodiodes 30 and covers surfaces of these components which are not covered by the carrier 7.

The potting body 6 forms an optical unit 4 for directing, guiding and/or focusing the electromagnetic radiation 2.

In the exemplary embodiment in FIG. 1, the optical unit 4 comprises optical elements 41 embodied as reflective surfaces. The electromagnetic radiation 2 emitted by the transmitter 1 is firstly reflected by an optical element 41, such that it passes parallel to the main extension plane or top surface 71 of the carrier 7. After a further reflection at a further optical element 41, the electromagnetic radiation 2 passes perpendicularly with respect to the main extension plane or top surface 71 of the carrier 7 and impinges on the receiver 3 at the radiation entrance side 31.

An input voltage UI is present at the transmitter 1. An output voltage UO is present at the receiver 3. The input voltage and the output voltage may be identical or different. The optoelectronic device may thus be configured for transferring energy and/or for voltage conversion.

The deflection of the electromagnetic radiation 2 at the optical elements 41 may take place by way of total internal reflection, for example, or the outer surface of the potting body 6 may be coated with a reflective material configured for reflecting the electromagnetic radiation 2, for example from the infrared range. For example, the optical element 41 may comprise a coating composed of gold or silver.

A further exemplary embodiment of a device described here is explained in greater detail in association with FIG. 2. In contrast to the exemplary embodiment in FIG. 1, the optical element 42 of the optical unit 4 above the receiver 3 comprises a structuring, which may be embodied for example as a freeform lens or a microstructure. Furthermore, it is possible for the structuring to comprise reflective particles, for example composed of titanium dioxide. By way of such an optical element 42, the electromagnetic radiation at the radiation entrance side 31 may be distributed over a larger area, for example over many photodiodes 30. This is particularly highly suitable if the electromagnetic radiation from a transmitter 1 having fewer surface emitters 10, for example, is intended to be distributed over a receiver 3 having more photodiodes 30 than surface emitters 10.

Figures 3, 4:
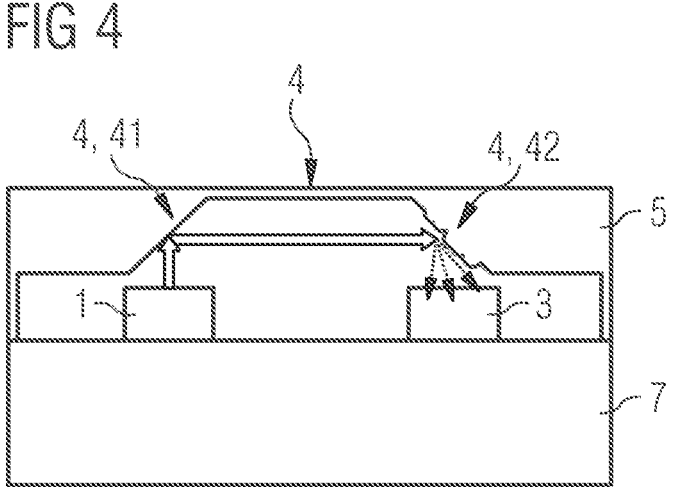

A further exemplary embodiment of an optoelectronic device described here is explained in greater detail in association with the schematic sectional illustration in FIG. 3. In contrast to the exemplary embodiment in FIG. 1, the device here does not comprise a potting body 6, rather the transmitter 1 and the transmitter 3 are surrounded by a common housing 5. The housing 5 is a cover forming an optical unit 4, for example. In the exemplary embodiment in FIG. 3, the optical unit 4 comprises optical elements 41 embodied as reflective surfaces. The housing 5 may be constituted for example with a metal or a plastic material such as an epoxy-based material or a silicone-based material. The optical elements 41 may be formed for example by a reflective coating comprising gold or silver or reflective particles comprising titanium dioxide, for example.

In contrast to the exemplary embodiment in FIG. 3, the schematic sectional illustration in FIG. 4 shows one exemplary embodiment of a device described here in which an optical element 42 is formed above the receiver 3, said optical element comprising a structuring which for example is a freeform lens or is configured to scatter radiation in order to distribute the electromagnetic radiation 2 once again over a larger area.

Figure 5A:
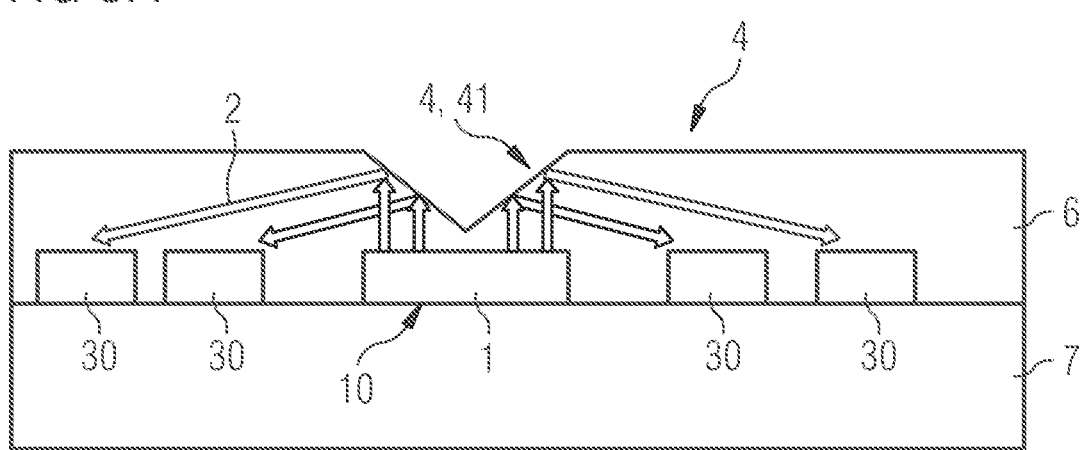
Figure 5B:
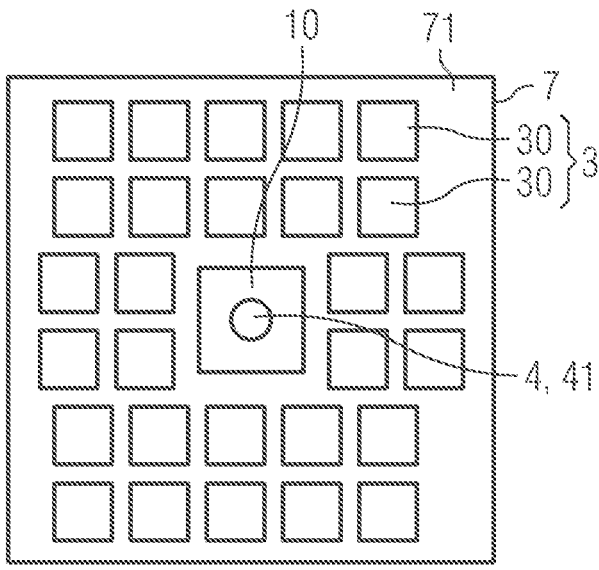

A further exemplary embodiment of a device described here is explained in greater detail in association with the schematic sectional illustrations in FIGS. 5A and 5B. In this case, FIG. 5A shows a schematic sectional illustration and FIG. 5B shows a schematic plan view of an exemplary embodiment of a device described here.

In the exemplary embodiment in FIGS. 5A and 5B, the device comprises a plurality of photodiodes 30 arranged on the top surface 71 of the carrier for example point-symmetrically around the transmitter 1, which comprises a single surface emitter 10, for example. Transmitter 1 and receiver 3 are surrounded by a potting body 6, which forms an optical unit 4 having optical elements 41 configured to reflect radiation. The optical elements 41 deflect the electromagnetic radiation 2 generated in the transmitter onto the radiation entrance sides 31 of the photodiodes 30. In this case, the optical element 41 is embodied for example as a conical recess in the potting body 6, the lateral surface of the cone being embodied as reflective. A correspondingly configured housing 5 as described in association with FIGS. 3 and 4 may also be used instead of the potting body 6.

Figure 6A:
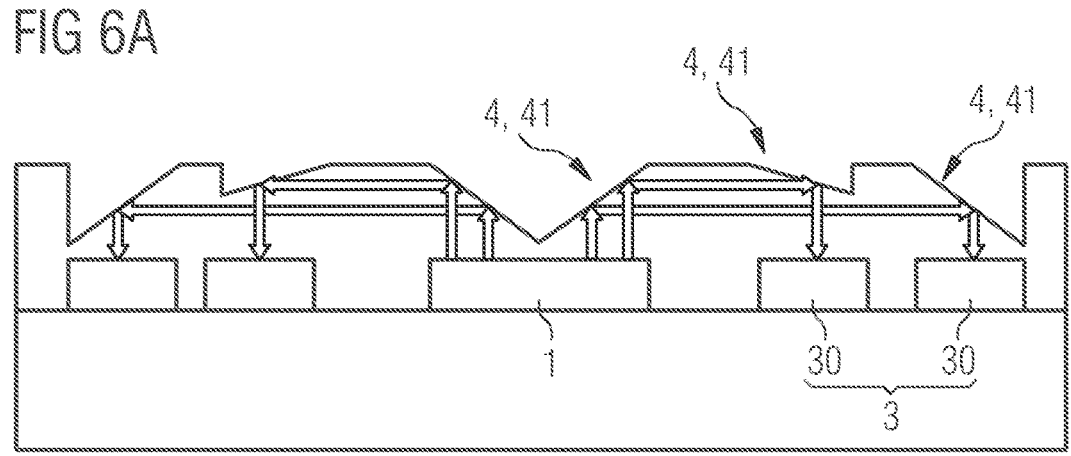
Figure 6B:
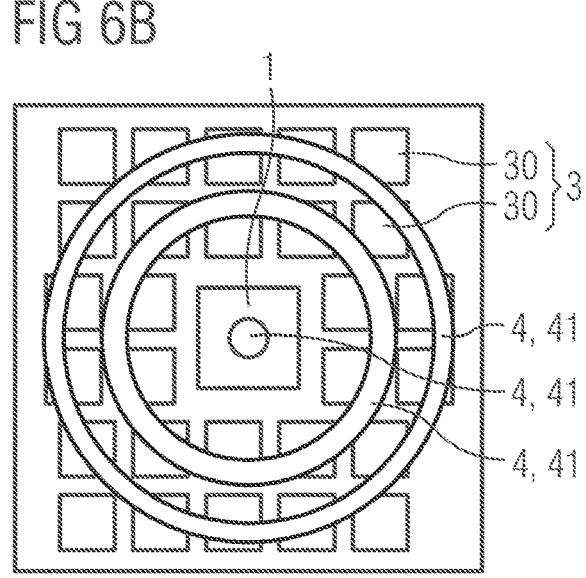
Figure 6C:
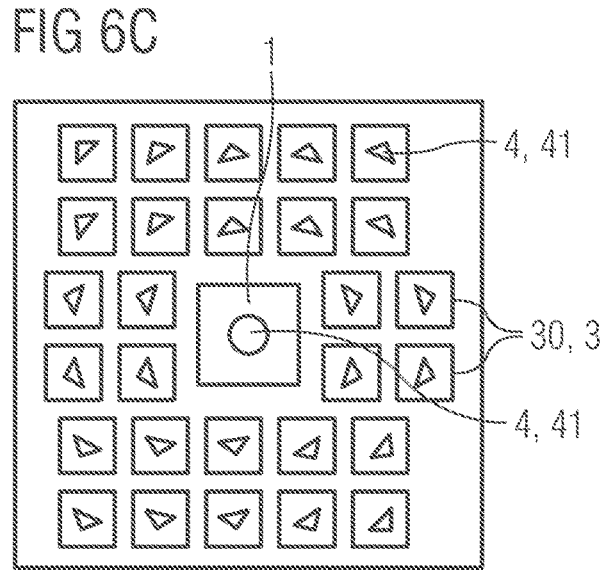

In association with FIGS. 6A, 6B and 6C, further exemplary embodiments of optoelectronic devices described here are explained in greater detail on the basis of schematic illustrations. In contrast to the exemplary embodiment in FIGS. 5A and 5B, the potting body 6 here has a plurality of optical elements 41 embodied as reflective surfaces, for example, which direct the electromagnetic radiation either in concentric rings, as illustrated in FIG. 6B, onto the photodiodes 30. In this case, the outer ring is formed more deeply in the potting body 6 than the inner ring in order to avoid shading by the inner ring.

Alternatively, as shown in FIG. 6C, it is possible for an optical element 41 to be assigned one-to-one to each photodiode 30.

As an alternative to the potting body 6, correspondingly configured housings 5 may also be used in the exemplary embodiments in FIGS. 6A to 6C.

Advantageously, a three-dimensional packaging is not required for the optoelectronic devices of the exemplary embodiments described in association with FIGS. 1 to 6, since transmitter and receiver are arranged on the top surface 71 of a common carrier 7. The optoelectronic devices of these exemplary embodiments may therefore also be produced at the wafer level, for example.

Figure 7:
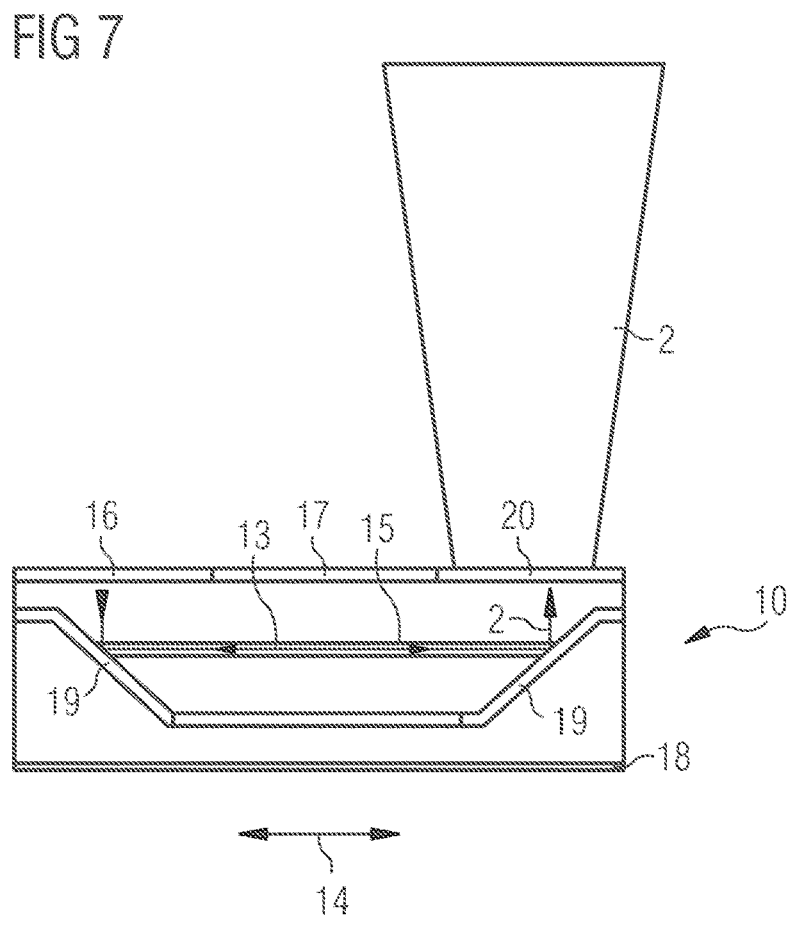

A surface emitter 10 for exemplary embodiments of optoelectronic devices described here is explained in greater detail in association with FIG. 7 on the basis of a schematic sectional illustration. The surface emitter 10 comprises an active layer 15, in which the electromagnetic radiation 2 is generated. The electromagnetic radiation 2 is reflected by obliquely extending mirrors 19, which extend for example at an angle of at least 30 to at most 60°, in particular 45°, with respect to the main extension plane of the active region 15 and with respect to the resonator axis 13.

The electromagnetic radiation 2 is further reflected by the highly reflective mirror 16 and by the partly transmissive mirror 20 and may emerge at the partly transmissive mirror 20.

A contacting may be effected via the first contact 17 and the second contact 18.

In a departure from the illustration in FIG. 7, the surface emitter 10 may also comprise a plurality of active regions 15 which are connected to one another by tunnel diodes and are arranged one above another. Higher output powers are possible as a result. If at the same time the receiver 3 has a plurality of detecting layers, the wavelengths of the electromagnetic radiation 2, which are generated in the transmitter 1, and the detecting layers may be coordinated with one another.

The surface emitter illustrated in FIG. 7 may form a superluminescence diode or a laser. This may be adjusted by way of the reflectivity of the partly transmissive mirror 20. Furthermore, a partly reflective mirror may likewise be used instead of the highly reflective mirror 16. In this case, the surface emitter 10 may emit electromagnetic radiation 2 by way of both partly reflective mirrors.

A further exemplary embodiment of an optoelectronic device described here is explained in greater detail with reference to the schematic illustration in FIG. 8. By way of example, the surface emitter 10 illustrated in association with FIG. 7 may be used as surface emitter 10 in this exemplary embodiment. This applies to all exemplary embodiments of optoelectronic devices described here. Furthermore, it is possible for other surface emitting superluminescence diodes or VCSELs to be used as surface emitters 10 in the exemplary embodiments explained here.

Figure 8:
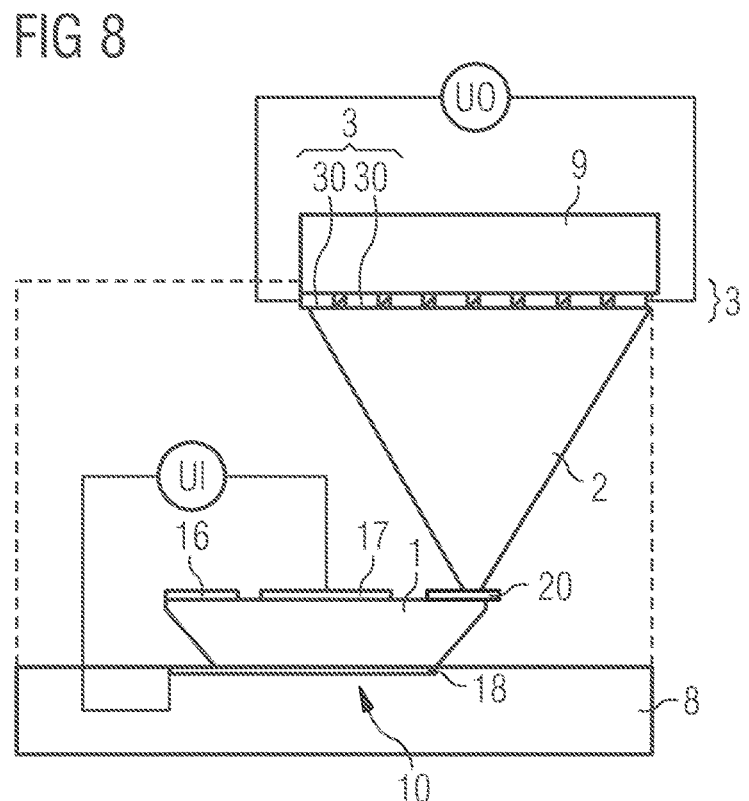

In the exemplary embodiment in FIG. 8, the transmitter 1 is arranged on a first carrier 8. Situated opposite the transmitter 1, the receiver 3 is arranged on a second carrier 9. The space between the transmitter 1 and the receiver 3 may remain free or may be filled with an electrically insulating material, for example with a potting body. The transmitter 1 is operated with the input voltage UI. The output voltage UO is dropped across the receiver 3.

The receiver 3 comprises a plurality of photodiodes 30 arranged next to one another on the carrier 9.

Figure 9:
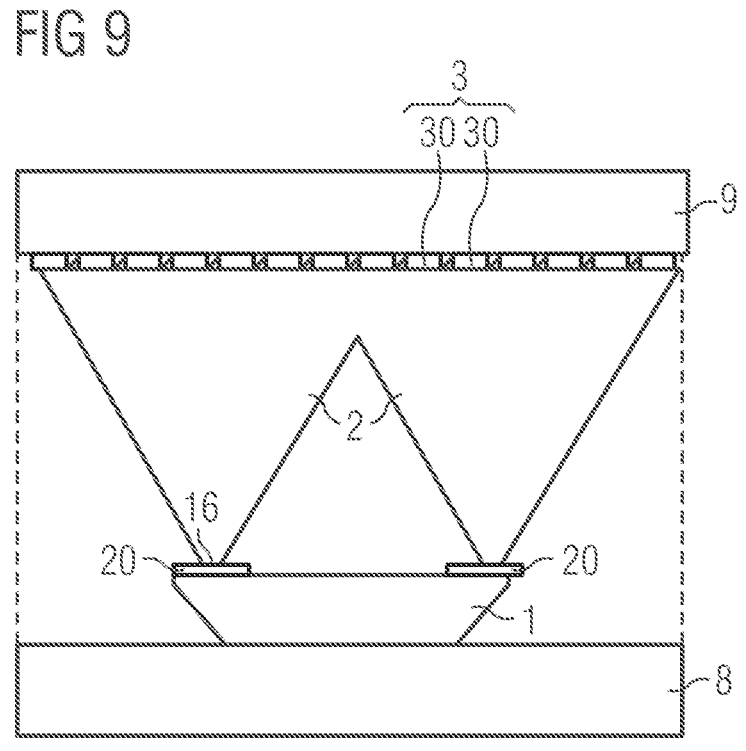

In contrast to the exemplary embodiment in FIG. 8, one exemplary embodiment of a device described here in which the surface emitter 10, as described above, comprises two partly reflective mirrors and therefore emits electromagnetic radiation 2 at two points in the direction of the receiver 3 is explained in greater detail in association with the schematic sectional illustration in FIG. 9. In this way, with a distance between transmitter 1 and receiver 3 remaining constant, a larger area of photodiodes 30 may be illuminated.

Figure 10:
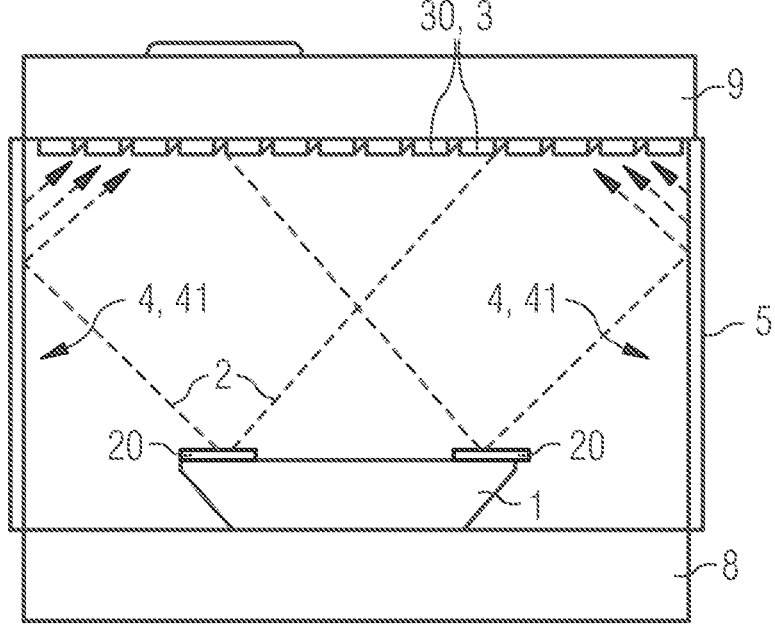

In the exemplary embodiment in FIG. 10, an optoelectronic device which, in contrast to the exemplary embodiment in FIG. 9, comprises a housing 5, which forms or comprises an optical unit 4, is explained in greater detail on the basis of a schematic sectional illustration. In this case, on the inner side facing the transmitter 1 and the receiver 3, the housing 5 is provided with an optical element 41 embodied as a reflective surface. The optical element 41 may be formed for example by a reflective coating as described further above. Such an optical unit 40 makes it possible, in particular, to direct a larger proportion of the radiation 2 onto the outer photodiodes 30, as a result of which overall the photodiodes 30 of the receiver 3 may be illuminated more uniformly than is the case for the exemplary embodiment in FIG. 9.

Figure 11:
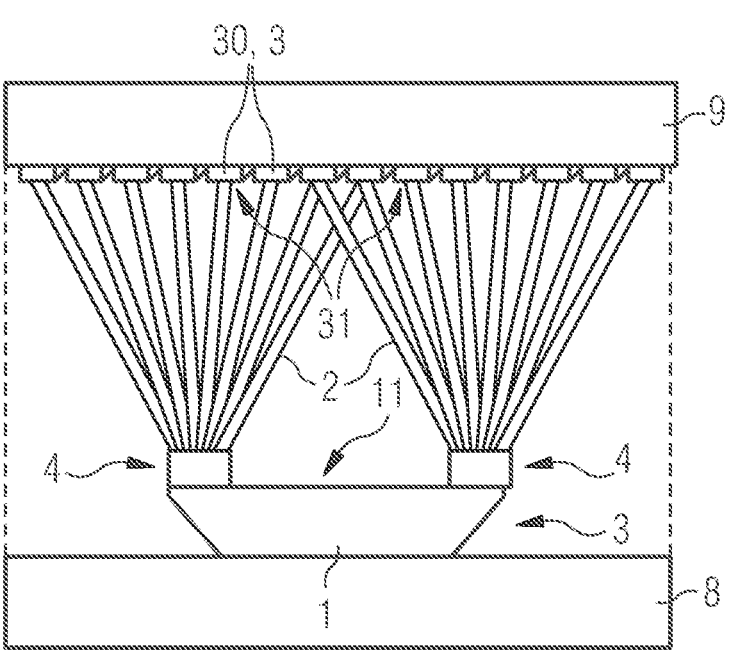

In contrast to the exemplary embodiments in FIGS. 8 to 10, on the basis of the schematic sectional illustration in FIG. 11 an explanation is given of a further exemplary embodiment of an optoelectronic device described here in which diffractive optical elements are arranged at the radiation exit side 11 of the surface emitter 10, said optical elements being configured to deflect the electromagnetic radiation 2 in a targeted manner onto the radiation entrance sides 31 of individual photodiodes 30. As a result, inactive areas between the photodiodes 30 are not irradiated, whereby the device becomes more efficient overall. Applying the diffractive optical elements 4 disadvantageously requires an increased alignment outlay.

Figure 12:
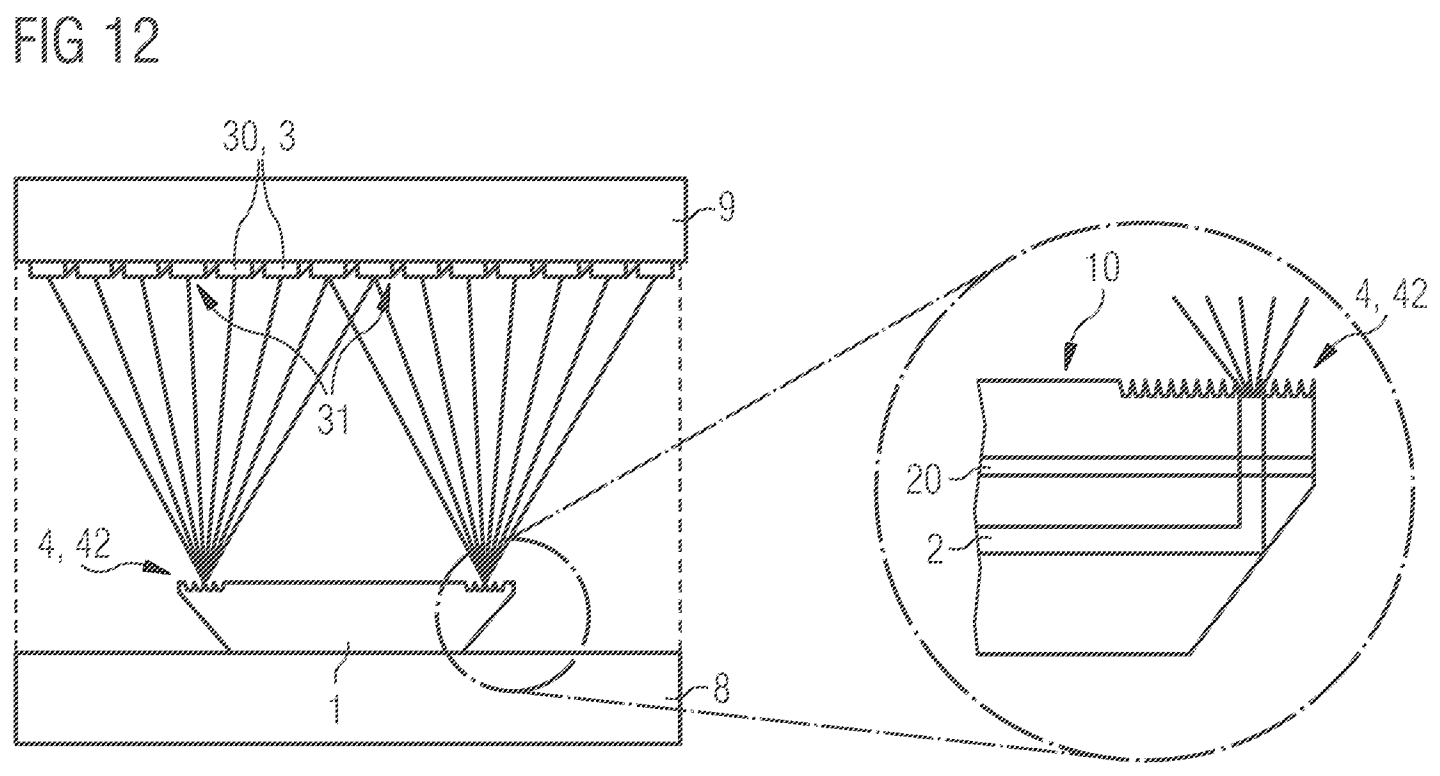

In contrast to the exemplary embodiment in FIG. 11, one exemplary embodiment in which the optical unit 4 is formed by structurings 42 directly in the semiconductor material of the surface emitter 10 is explained in greater detail in association with FIG. 12. The partly transmissive mirror 20 may be embodied by a Bragg mirror in the layer stack of the surface emitter 10. The partly transmissive mirror 20 may be dispensed with if the surface emitter 10 is operated as a superluminescence diode. In this case, introducing the optical unit 4 into the surface emitter 10 may be more cost-effective in contrast to applying optical units 4 to the surface emitter 10.

Figure 13:
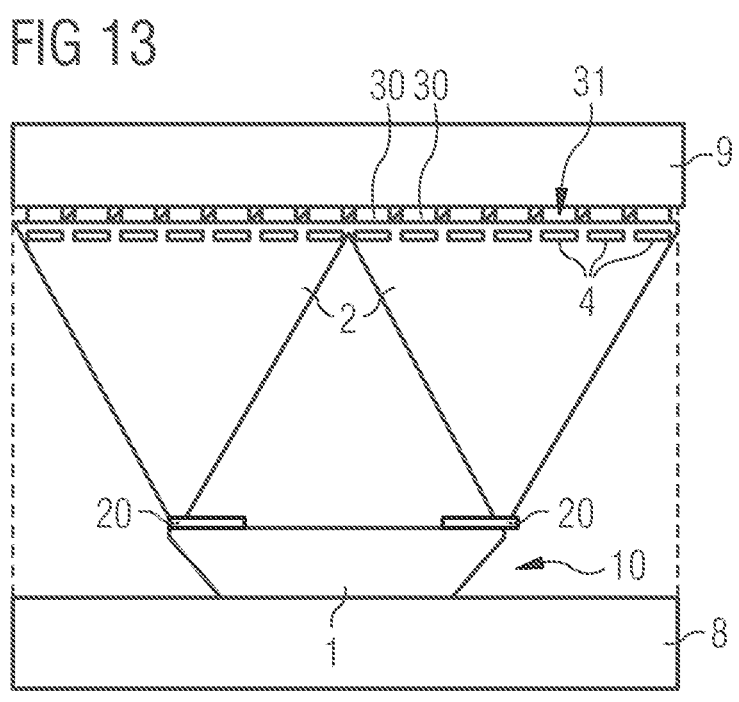

In contrast to the exemplary embodiments in FIGS. 11 and 12, an optoelectronic device in which optical units 4 formed by a microlens array, for example, are fitted at the radiation entrance side 31 of the photodiodes 30 is described in association with the schematic sectional illustration of the exemplary embodiment in FIG. 13. In this case, an optical unit 4 is assigned one-to-one to each photodiode 30.

The microlens array may be applied in various ways. By way of example, it is possible to apply each microlens individually to the assigned photodiode. Furthermore, a plurality of optical units 4 may be applied simultaneously at the wafer level for example by applying spin-on glass and subsequent structuring. Moreover, spin-on glass may be applied to a photodiode wafer in order to smooth and insulate the photodiodes 30 and to protect them from mechanical and chemical external influences. Afterward, discrete microlenses consisting of silicon dioxide, for example, may be applied to the spin-on glass. Reflections between the spin-on glass and the microlenses consisting of the same material are reduced as a result. The device in this case advantageously has a particularly high efficiency since the entire electromagnetic radiation is focused onto the photodiodes 30. In comparison with diffractive optical elements as described in association with FIG. 11, for example, this solution also has a lower alignment outlay. It may disadvantageously transpire that applying the microlenses at the wafer level is difficult in terms of process engineering.

Figure 14:
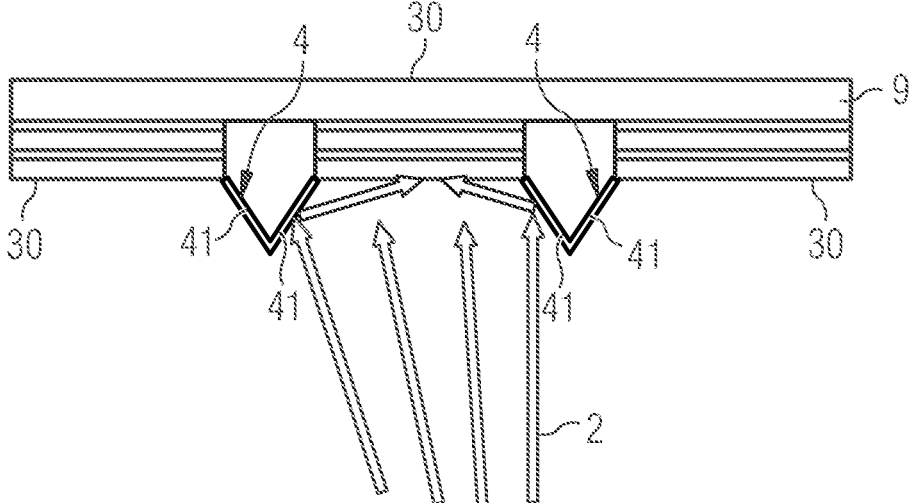

A further exemplary embodiment of a device described here is explained in greater detail in association with FIG. 14. The schematic sectional illustration in FIG. 14 shows a plurality of photodiodes 30 arranged next to one another on a common second carrier 9. Optical units 4 comprising optical elements 41 embodied reflective as surfaces are applied between the photodiodes 30. The optical units 4 make it possible for radiation 2 that impinges in the region between the photodiodes 30 to be directed onto the photodiodes.

These optical units 4 may be applied at the wafer level. For example, for this purpose, electrically insulating structures may be introduced and shaped or spin-coated between the photodiodes, with the subsequent optical elements 41 being applied thereto as a metal coating.

Furthermore, it is possible for a prestructured frame to be applied to the array of photodiodes 30 and secured thereto. The frame may comprise metal-printed polydimetal siloxane, for example.

Furthermore, it is alternatively possible to introduce silicone and metal through a stencil into the interspaces between the photodiodes 30.

The dielectric material of the optical unit 4 between the photodiodes may electrically insulate the latter from one another. Furthermore, it constitutes mechanical and chemical protection of the photodiodes, for example from moisture. Conductor tracks and contact points on the carrier 9 may also be mechanically and chemically protected by the optical units 4.

Figure 15A:
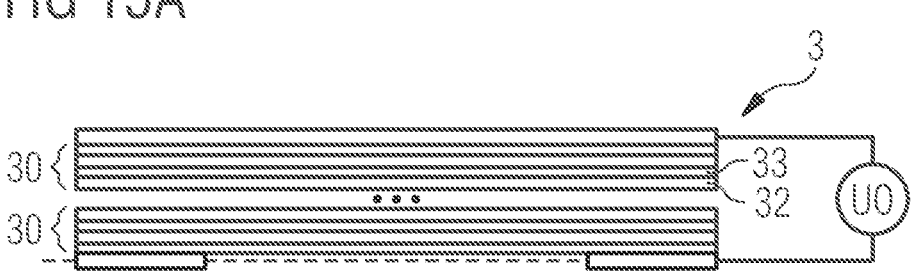

In association with the schematic sectional illustration in FIG. 15A, a configuration of the receiver 3 which may be used in exemplary embodiments of optoelectronic devices described here is illustrated in greater detail on the basis of a schematic sectional illustration. In this case, the receiver 3 comprises a plurality of photodiodes 30 grown one above another in a monolithically integrated manner. The photodiodes 30 respectively comprise detecting layers 33 separated from one another by tunnel junctions 32. In this way, the photodiodes 30 in the layer stack are interconnected in series with one another.

Figure 16:
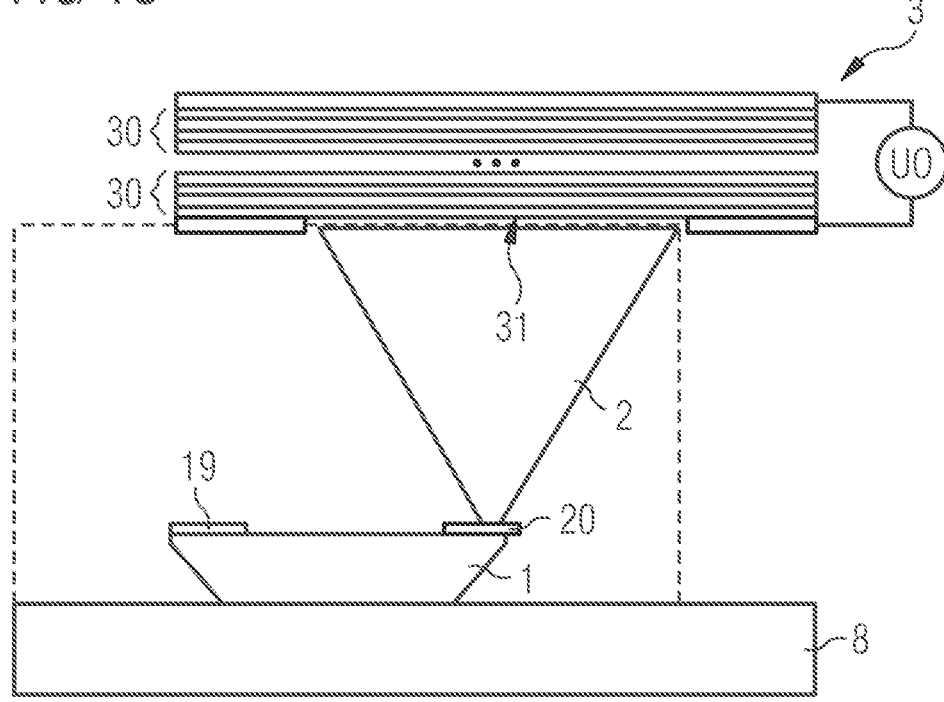

The schematic sectional illustration in FIG. 16 shows one exemplary embodiment of a device described here comprising such a receiver. Advantageously, the area at the radiation entrance side 31 may be made particularly large in this case.

Figure 15B:
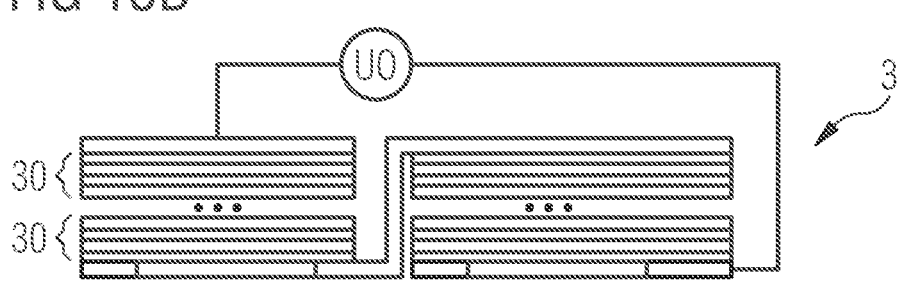

A configuration of the receiver 3 in which two layer stacks of photodiodes 30 as illustrated in FIG. 15A are interconnected in series with one another is shown in association with FIG. 15B.

Figure 17:
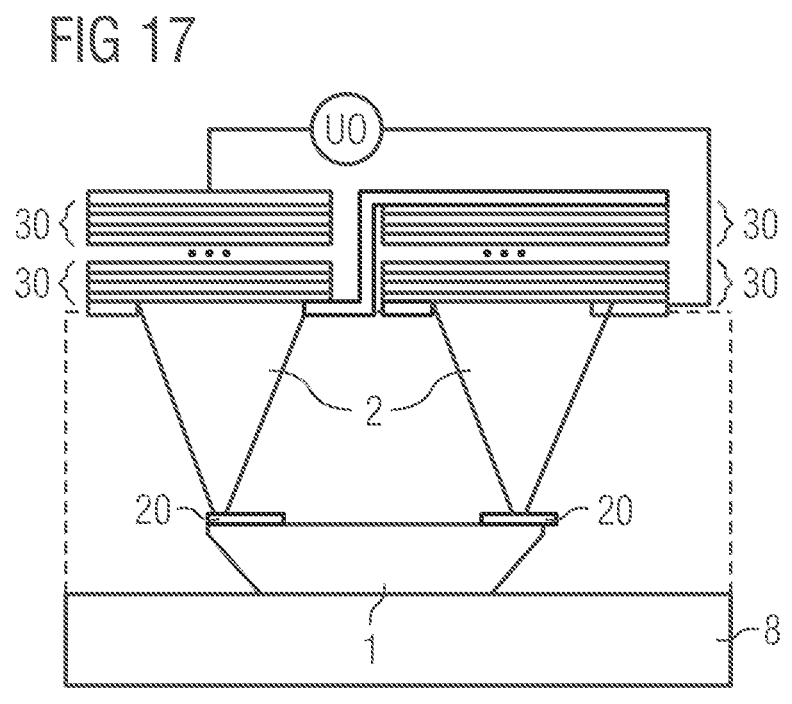

The schematic sectional illustration in FIG. 17 shows corresponding optoelectronic device in which two beam cones of electromagnetic radiation 2 may be directed onto the corresponding sections of the receiver 3.

Figure 18A:
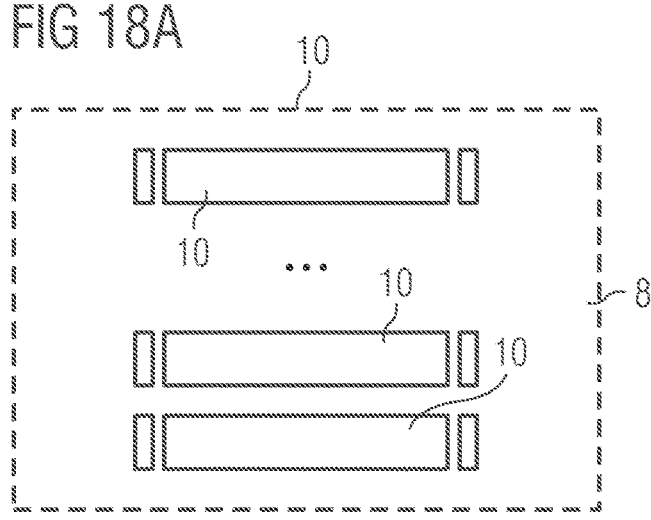
Figure 18B:
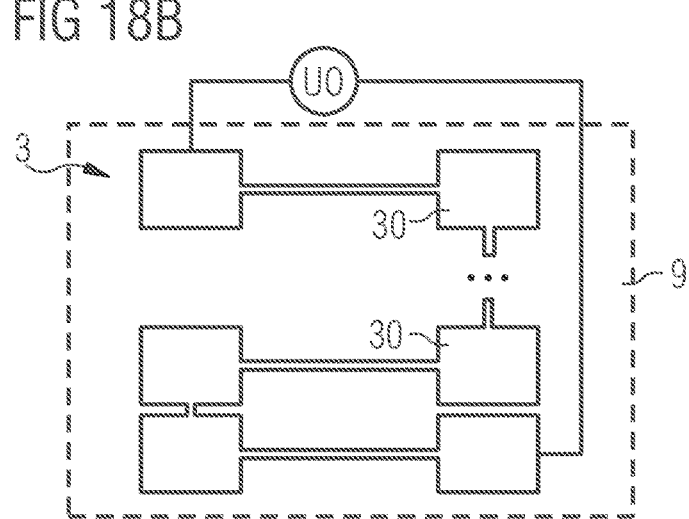
Figure 18C:
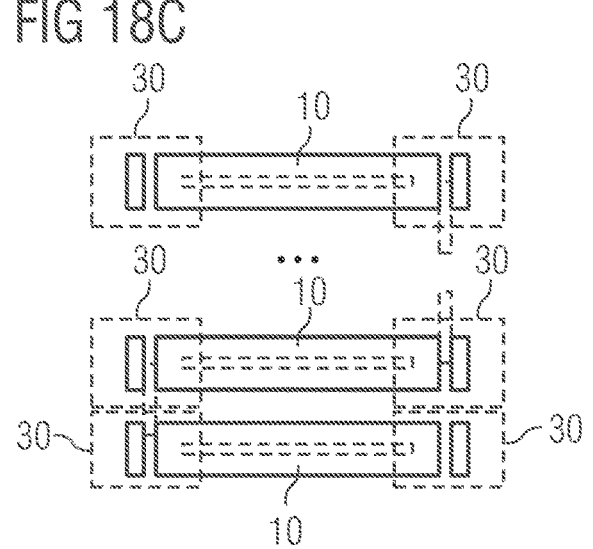

Further exemplary embodiments of f optoelectronic devices described here are explained in greater detail in association with the schematic plan views in FIGS. 18A to 18C.

The schematic sectional illustration in FIG. 18A shows a plan view of a plurality of surface emitters 10, which may be interconnected in series or in parallel with one another. A corresponding number of photodiodes 30, which may likewise be interconnected in series and/or in parallel with one another, may be arranged opposite the surface emitters 10.

The schematic plan view in FIG. 18C schematically shows the alignment of the photodiodes 30 with respect to the individual surface emitters 10. Depending on how the surface emitters 10 and the photodiodes 30 are interconnected, the device may enable a voltage conversion from lower input voltages UI to higher output voltages UO or from higher input voltages UI to lower output voltages UO.

The invention is not restricted to the exemplary embodiments by the description on the basis thereof. Rather, the invention encompasses any novel feature and also any combination of features, which includes in particular any combination of features in the patent claims, even if this feature or this combination itself is not explicitly specified in the patent claims or exemplary embodiments.

The invention claimed is:

1. An optoelectronic device comprising:
a transmitter configured to emit electromagnetic radiation and to be operated with an input voltage,
a receiver configured to receive the electromagnetic radiation and to supply an output voltage, wherein
the transmitter comprises two or more surface emitting lasers configured to emit electromagnetic radiation from different wavelength ranges,
the receiver comprises two or more series-connected photodiodes coordinated with the different wavelength ranges and configured as detecting layers, between which are arranged tunnel diodes that interconnect the detecting layers in series with one another; and
an optical unit that directs or guides the electromagnetic radiation from the transmitter to the receiver.

2. The optoelectronic device as claimed in claim 1, wherein the input voltage is less than the output voltage.

3. The optoelectronic device as claimed in claim 1, wherein the optical unit is integrated into a housing for the transmitter and the receiver or the optical unit is part of the housing.

4. The optoelectronic device as claimed in claim 1, wherein the optical unit is integrated into a potting body for the transmitter and the receiver or the optical unit is part of the potting body.

5. The optoelectronic device as claimed in claim 1, wherein the optical unit comprises two or more optical elements.

6. The optoelectronic device as claimed in claim 1, comprising a carrier having a top surface, wherein the transmitter and the receiver are arranged at the top surface and a radiation exit side of the transmitter and a radiation entrance side of the receiver are directed away from the top surface.

7. The optoelectronic device as claimed in claim 1, comprising a first carrier, on which the transmitter is arranged, and a second carrier, on which the receiver is arranged, wherein the first carrier and the second carrier are arranged opposite one another.

8. The optoelectronic device as claimed in claim 1, wherein at least one surface emitting laser has a resonator having a resonator axis running parallel to a main extension plane of an active region of the laser, wherein the laser is configured to the effect that the electromagnetic radiation leaves the laser transversely or perpendicularly with respect to the resonator axis.

9. An optoelectronic device comprising:
a transmitter configured to emit electromagnetic radiation and to be operated with an input voltage,
a receiver configured to receive the electromagnetic radiation and to supply an output voltage, wherein
the transmitter comprises two or more surface emitting lasers configured to emit electromagnetic radiation from different wavelength ranges,
the receiver comprises two or more series-connected photodiodes coordinated with the different wavelength ranges and configured as detecting layers, between which are arranged tunnel diodes that interconnect the detecting layers in series with one another; and
an optical unit that directs or guides the electromagnetic radiation from the transmitter to the receiver,
wherein the optical unit is integrated into a potting body for the transmitter and the receiver.

* * * * *